United States Patent [19]

Ishigami et al.

[11] Patent Number: 4,486,681
[45] Date of Patent: Dec. 4, 1984

[54] Y-SHAPED SUPPORT FOR PIEZOELECTRIC RESONATOR

[75] Inventors: Sumiyuki Ishigami; Mitsuru Sato, both of Tokyo, Japan

[73] Assignees: Tokyo Denpa Kabushiki Kaisha; Kabushiki Kaisha Goto Seisakusko, both of Tokyo, Japan

[21] Appl. No.: 417,451

[22] Filed: Sep. 13, 1982

[30] Foreign Application Priority Data

Sep. 21, 1981 [JP] Japan ............................ 56-150036

[51] Int. Cl.³ .......................................... H01L 41/08
[52] U.S. Cl. ................................................ 310/353
[58] Field of Search ......................... 310/348, 351–355

[56] References Cited

U.S. PATENT DOCUMENTS

| | | | |
|---|---|---|---|
| 2,824,219 | 2/1958 | Fisher et al. | 310/353 X |
| 3,751,692 | 8/1973 | Choffat | 310/352 X |
| 3,857,146 | 12/1974 | Engdahl | 310/352 X |
| 3,913,195 | 10/1975 | Beaver | 310/351 X |
| 4,267,479 | 5/1981 | Kato | 310/351 X |
| 4,273,399 | 6/1981 | Myers | 310/353 X |

FOREIGN PATENT DOCUMENTS

| | | | |
|---|---|---|---|
| 51886 | 4/1977 | Japan | 310/351 |
| 42088 | 4/1977 | Japan | 310/351 |

*Primary Examiner*—Mark O. Budd
*Attorney, Agent, or Firm*—Toren, McGeady and Stanger

[57] ABSTRACT

A quartz unit is arranged to permit its automatic manufacture of it. The quartz unit includes a quartz vibrator; a pair of opposed terminal metal fittings each consisting of a stem part, branch parts protruding from one end of the stem part on two sides thereof to form a Y shape and support parts protruding from the fore ends of the branch parts to carry jointly the quartz vibrator; electrodes of the quartz vibrator connected to the terminal metal fittings through the support parts; and a container consisting of front and rear halves which are joined together to effect sealing with the metal fittings interposed in between them. The stem, branch and support parts are obtained by punching from a metal plate in one unified body.

9 Claims, 24 Drawing Figures

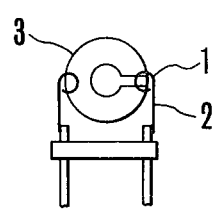
FIG.1(a)
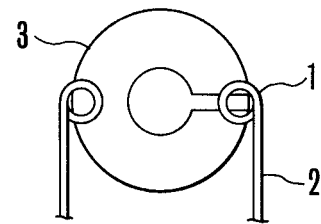
FIG.1(b) PRIOR ART
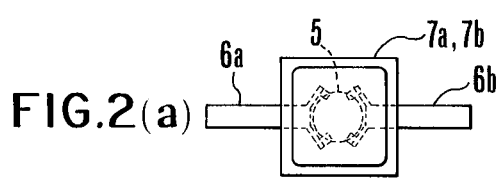
FIG.2(a)
FIG.3(a) FIG.3(b)
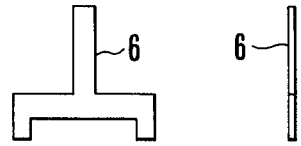
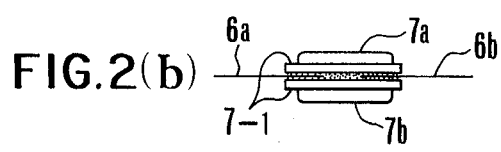
FIG.2(b)
FIG.4(a) FIG.4(b)
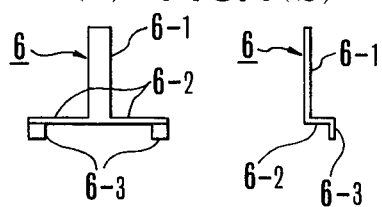
FIG.5(a) FIG.5(b)
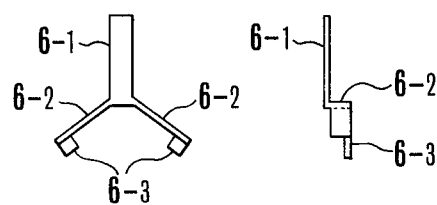

Y-SHAPED SUPPORT FOR PIEZOELECTRIC RESONATOR

BACKGROUND OF THE INVENTION

1. Field of the Invention

This invention relates to a method of manufacturing a quartz unit in which assembly work and even the fine adjustment of frequency are carried out automatically.

2. Description of the Prior Art

Heretofore, the quartz vibrator of a quartz unit, particularly in the case of a quartz unit of the AT or BT cut type, has been arranged to be carried by wire clips or ribbon clips. Referring to the accompanying drawings, FIG. 1(a) shows an example of the quartz unit using wire clips while FIG. 1(b) shows an enlarged view thereof. Each support member 2 has its fore end formed into a coil shaped clip 1. The quartz vibrator 3 is carried by these support members 2 with its periphery pinched by these clips 1. The ribbon clip arrangement is also similar to this. These conventional quartz vibrator supporting arrangements have necessitated entrusting the most part of the assembly work to the manual work of skilled workers.

The heavy reliance on the manual assembly work on the quartz vibrator has inevitably resulted in some deformation of the support members. Correction of such deformation then has resulted in a mechanical residual stress which in turn has affected the quartz vibrator to result inevitably in some detriment of the properties of the quartz vibrator. The conventional arrangements thus have been lacking uniform workability required for obtaining a quartz unit of high precision.

SUMMARY OF THE INVENTION

It is therefore a general object of the present invention to provide a quartz unit which is arranged to permit automation of the assembly work, frequency adjustment and even test work on the quartz units by means of robots without having recourse to the skill of workers.

The above and further objects, features and advantages of the invention will become apparent from the following detailed description of the preferred embodiments thereof taken in connection with the accompanying drawings.

BRIEF DESCRIPTION OF THE DRAWINGS

FIGS. 1(a) and 1(b) are a front view and an enlarged view thereof showing the conventional quartz unit of the wire clip type.

FIGS. 2(a) and 2(b) are a plan view and a front view respectively showing a quartz unit as an embodiment of the invention.

FIGS. 3(a) and 3(b) are a plan view and a side view respectively showing the original shape of a metal piece to be formed into a terminal metal fitting.

FIGS. 4(a) and 4(b) are a plan view and a side view respectively showing the metal piece as halfway in a process of being bent.

FIGS. 5(a) and 5(b) are a plan view and a side view showing the terminal metal fitting obtained from the metal piece by further bending the branch parts of the metal piece into a Y shape.

DETAILED DESCRIPTION OF PREFERRED EMBODIMENTS

Figures 6A, 6B:
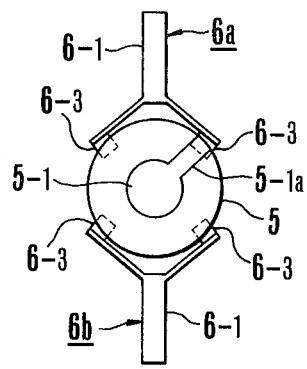
FIGS. 6(a) and 6(b) are plan view and a side view respectively showing a quartz vibrator as in a state of being mounted on a pair of opposed terminal metal fittings.

FIGS. 2(a) and 2(b) show an example of applying the invention to a quartz unit. A quartz vibrator 5 which is shown with a broken line is carried by terminal metal fittings 6a and 6b and is covered from front and rear with container halves 7a and 7b which are made of an insulating material such as glass. The peripheral portions 7-1 of, the container halves 7a and 7b are provided with a coating. The terminal metal fittings 6a and 6b are interposed in between these peripheral portions 7-1 and airtightly sealed by pressure joining and heating together with the terminal metal fittings 6a and 6b.

Drawings from FIG. 3 through FIG. 5 show the details of the above-stated terminal metal fittings 6a and 6b. A thin metal piece 6 shaped as shown in FIG. 3(a) is bent into a stem part 6-1, branch parts 6-2 and support parts 6-3 as shown in FIGS. 4(a) and 4(b). Then, the branch parts 6-2 are further bent into a Y shape relative to the stem part 6-1 to obtain the terminal metal fitting 6a or 6b as shown in a plan view and a side view in FIGS. 5(a) and 5(b).

In assembling, the terminal metal fittings 6a and 6b are set opposite to each other in horizontal positions as shown in FIGS. 6(a) and 6(b). On these terminal metal fittings, is mounted the quartz vibrator 5 to be carried by the support parts 6-3 of the terminal metal fittings. In this instance, it is essential to have the lead-out parts 5-1a of the front and back electrodes 5-1 of the quartz vibrator 5 in contact with at least one of the two support parts 6-3 of each terminal metal fitting 6a or 6b.

With the quartz vibrator 5 thus mounted, a conductive coating material is dropped onto each of the support parts. The coating material is then heated and allowed to harden. The quartz vibrator 5 is thus secured to the support parts and is carried thereby with sufficient mechanical strength. Meanwhile, the electrodes 5-1 on the front side and the back side are connected respectively to the terminal metal fittings 6a and 6b.

Figure 7:
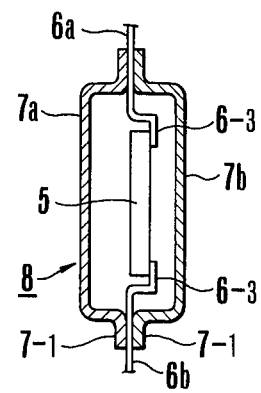
FIG. 7 is a sectional view of the quartz unit as in a state of having been completed by covering and sealing it with a container from front and rear sides thereof.

After that, the quartz vibrator is covered with container halves or containers 7a and 7b from front and rear as shown in FIG. 7. The inner surfaces 7-1 of the containers 7a and 7b in the periphery portions of them have been provided with some coating beforehand respectively. The containers are then joined together by softening the coating with heating by means of an infrared ray or the like and then by allowing the coating to harden. With the coating thus hardened a quartz unit 8 is obtained in an airtight sealed state.

Since the quartz vibrator 5 is carried by the support parts 6-3 formed at the fore ends of the branch parts of the terminal metal fittings which are bent into the Y shape, the quartz vibrator 5 is in a state of being carried by a highly flexible material, so that the quartz unit is made to have extremely stable characteristics. Further, the structural arrangement as shown in FIG. 6 can be arranged for quartz vibrator of different sizes. In other words, the bending angle of the branch parts 6-2 of each terminal metal fittings 6a or 6b relative to the stem part can be adjusted to obtain a Y shape that is most suited to the quartz vibrator to be used.

Further, the material and the thickness of the metal piece to be used for forming the terminal metal fittings 6a and 6b and the width, length, etc. of the stem and branch parts of them must be selected not to affect the properties of the quartz vibrator 5. They can be prepared without difficulty by ordinary thin metal plate processing technique including press punching, etching, etc.

Figure 8:
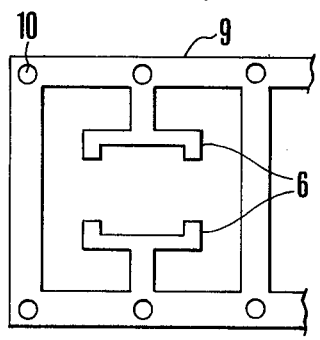
FIG. 8 is a plan view showing a frame consisting of a ribbon like metal piece obtained by punching as the original shape of terminal metal fittings.

The assembly work on the quartz unit of the construction described above can be automated by continuously arranging many terminal metal fittings in the following manner: One example of this is as shown in FIG. 8. In this case, many terminal metal fittings 6 of the shape as shown in FIG. 3 are formed on a thin strip of metal by a suitable process such as punching or the like to obtain the frame 9. The frame 9 is provided with perforation or guide holes 10 which are formed in the peripheral portion of the frame. The guide holes 10 permit automatic feeding for further processes.

Figure 9:
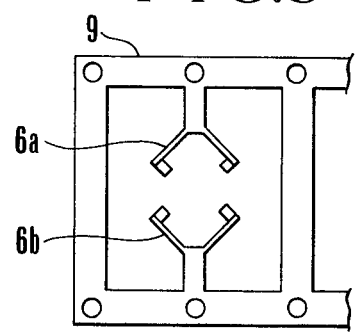
FIG. 9 is a plan view showing the terminal metal fittings as in a state of having been formed by bending the original shape of the frame.
Figure 10:
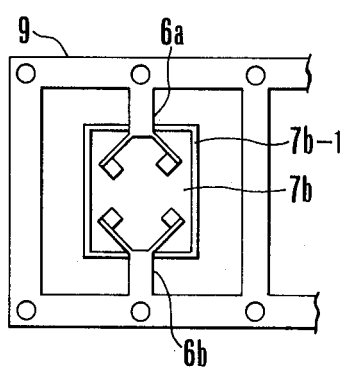
FIG. 10 is a plan view showing the frame as in a state of having been covered with a half part of a container from the rear.

More specifically stated, two terminal metal fittings 6 are formed in each section of the frame 9 and are disposed in the upper and lower positions in each section. In other words, the terminal metal fittings 6 are arranged to have one quartz unit at every section. Then, each of the terminal metal fittings is subjected to the bending process which is carried out as shown in FIGS. 3, 4 and 5 to obtain terminal metal fittings 6a and 6b having their fore ends formed into a Y shape as shown in FIG. 9. Meanwhile, one (7b) of the container halves 7a and 7b is prepared to have a predetermined inner part of the peripheral portion thereof coated with low melting point glass or the like beforehand. The container half 7b thus prepared is applied and secured to the rear sides of the opposed pair of terminal metal fittings 6a and 6b formed in each section as shown in FIG. 10.

The reason for securing one of the container halves to both the terminal metal fittings as described above resides in that: At the time of carrying out a partial vacuum evaporation process which will be described later herein, one (6a) of the pair of terminal metal fittings is cut off from the frame for the purpose of allowing the quartz unit to oscillate. With the metal fitting 6a thus cut off, the quartz vibrator 5 has to be carried solely by the other metal fitting 6b. If the container half is not arranged beforehand in the manner as described above, an excessive stress would be applied to the branch part 6-2 of the terminal metal fitting 6b and to the point at which the quartz vibrator 5 is supported. To solve this problem, one of the container halves is fixedly attached beforehand to both the pair of terminal metal fittings 6a and 6b as described above. This arrangement is of course unnecessary where the quartz vibrator is sufficiently supportable by the terminal metal fitting 6b alone. In such a case, both the front and rear container halves 7a and 7b can be mounted later at the time of the final process of sealing.

Figure 11A:
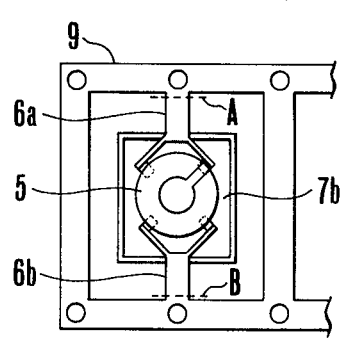
FIGS. 11(a) and 11(b) are a plan view and a perspective view showing the frame as in a state of having a quartz vibrator mounted thereof.

Referring now to FIG. 11(a), with the frame 9 horizontally set, a quartz vibrator 5 which has been sucked by an air chuck provided on the tip of a robot's arm (not shown) is laid on every section as shown in FIGS. 6(a) and 6(b) to be carried by the support parts 6-3 of the terminal metal fittings 6a and 6b. Following this, a conductive coating material is dropped onto each support part of the terminal metal fittings by a suitable constant delivery means. The coating material thus dropped is heated and hardened.

In laying the quartz vibrator on each section of the frame, the quartz vibrator must be so oriented as to have the lead-out parts 5-1a of the electrodes come into contact with at least one of the support parts 6-3 of the terminal metal fittings. However, in attaching the electrodes 5-1 to the quartz vibrator by vacuum evaporation, the evaporation process is carried out by determining the direction of the electrode lead-out part 5-1a. Therefore, at the time of laying the quartz vibrator on the frame, the labor required in judging the direction of the quartz vibrator can be saved by utilizing the direction thereof determined at the time of attaching the electrode. Again referring to FIG. 11, one 6a of the terminal metal fittings is cut at a part A as shown by a broken line. With the terminal metal fitting 6a cut off in that manner, the quartz unit of each section of the frame 9 becomes an independent quartz unit connected through the other terminal metal fitting 6b to other quartz units. Following that, fine adjustment of frequency is carried out by a partial vacuum evaporation process.

Figure 12:
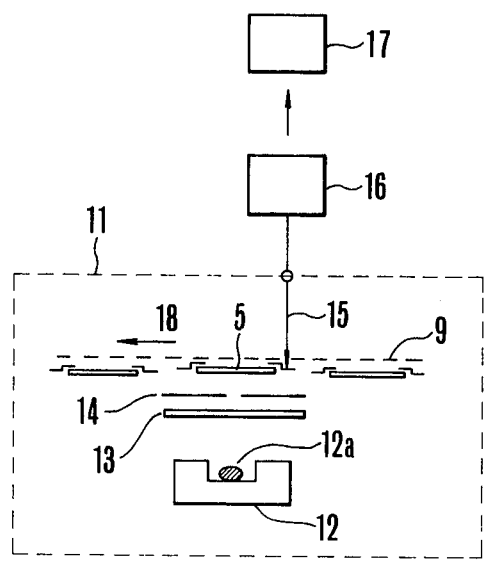
FIG. 12 is a schematic plan view showing a partial vacuum evaporation process.

This partial evaporation process is carried out in a manner as shown in FIG. 12. The arrangement for this process includes a vacuum tank 11; a vapor generator 12 which is arranged to generate the vapor of an evaporating material such as silver (Ag) by heating the material; a shutter 13; and a mask 14. First, the frame 9 which has a quartz vibrator mounted on every section thereof as shown in FIG. 11(a) is mounted in an arcuate manner on a mounting base with a small hole 12a of the vapor generator 12 located at the center of the frame.

Figure 11B:
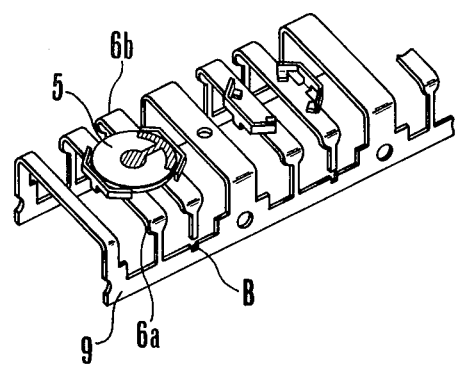

FIG. 11(b) shows a modification in which the IC type terminal metal fittings (frame) is provided with four terminals, and either of the terminals 6a and 6b is cut off from the frame 9, so that a plurality of quartz vibrators arranged on the terminal metal fittings can produce their own functions just as in the embodiment shown in FIG. 11(a) in which the terminal 60 is cut off at the portion A.

The above procedure is necessary for checking the resonance frequency or crystal impedance in the subsequent step.

The vapor of silver which is employed as evaporating material is arranged to be jetted out of the small hole 12a of the vapor generator 12. This vapor is normally blocked by the shutter 13. In carrying out frequency adjustment, each quartz vibrator 5 set in a predetermined position is connected to an external oscillation circuit 16 through a contactor 15 thus to form a quartz unit. Meanwhile, there is provided a monitor 17 which is arranged to monitor deviation of the frequency f of the oscillation of the quartz vibrator from a preset reference frequency.

Figure 13:
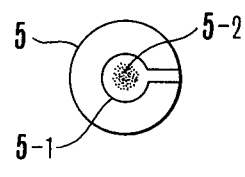
FIG. 13 is a plan view showing a quartz vibrator having silver applied thereto by partial plating.

The thickness of the quartz vibrator 5 is coarsely adjusted prior to the above-stated assembly work in such a way as to have the frequency thereof at a value a slightly higher than a prescribed frequency. At the time of the fine adjustment, the shutter 13 is opened to allow the silver vapor jetted out of the small hole 12a to be applied through the mask 14 onto the electrode 5-1 of the quartz vibrator 5 as represented by a part 5-2 in FIG. 13. The quantity of silver applied to the part 5-2 increases with time. The oscillation frequency decreases according as the silver quantity increases. When the monitor 17 detects that the oscillation frequency has reached the prescribed value, the shutter 13 is closed and the frame 9 is moved forward in the direction of arrow 18 to the extent of one section thereof to have next quartz vibrator in the position for the vacuum evaporation process. The quartz units in different sections of the frame 9 are thus adjusted to a prescribed frequency one after another.

After the fine adjustment of frequency, the quartz vibrator and the terminal metal fittings of every section is covered with a front half 7a of the insulating container which has been provided with a coating on the inner side of the peripheral portion 7-1 thereof. This covering process is carried out in a suitable atmosphere such as dry nitrogen gas ($N_2$) and is completed by heating and hardening the coating to obtain quartz units with the nitrogen gas tightly sealed within the container. Upon completion of this sealing process, the part B shown in FIG. 11(a) is cut off at each section of the frame to obtain individual quartz units.

In accordance with the method of the present invention as has been described in the foregoing, many frame sections are continuously arranged on a strip of metal sheet material with terminal metal fittings arranged to form an oscillator within each of these sections. This is followed by a sequence of steps of mounting the rear half of the container, laying each quartz vibrator in place, cutting one of the pair of terminal metal fittings, carrying out fine adjustment of frequency by a partial vacuum evaporation process, mounting of the front half of the container in a prescribed atmosphere and finally cutting off the other terminal metal fitting on the common side of the frame to obtain individual quartz units. All these steps can be automated without difficulty. This automation permits manufacture of quartz units of uniform characteristics without having recourse to the skill of workers.

In the embodiment described in the foregoing, the quartz vibrator is arranged to be supported at four points by the support parts two of which are provided on each of the pair of terminal metal fittings. In another embodiment, this supporting arrangement is replaced with arrangement to support it with three support parts in a manner as described below:

In this embodiment, the pair of terminal metal fittings shown in FIG. 8 is not formed into the same shape. One of them is modified to have only one support part instead of two. The quartz vibrator in this case is thus supported at three points instead of four. Further, the quartz vibrator is not limited to a circular shape but may be formed into any other shapes such as a rectangular shape, etc.

Figure 14:
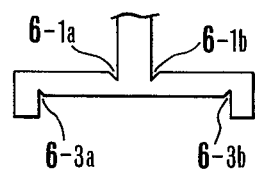
FIGS. 14 and 15 are plan views respectively showing terminal metal fittings as other embodiment examples.

FIG. 14 shows a further modification of the terminal metal fittings shown in FIG. 8. In this case, there are provided notches in the root parts 6-1a and 6-1b and parts 6-3a and 6-3b between the branch parts and the support parts as shown in FIG. 14. The provision of these notches facilitate the bending work on the terminal metal fittings for shaping them as shown in FIG. 5.

Figure 15:
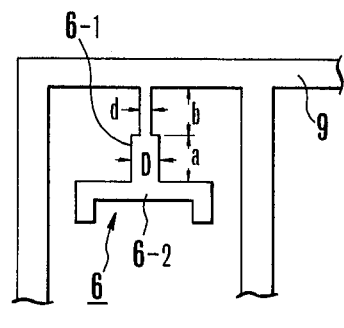
Figure 16A:
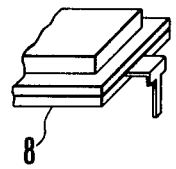
FIGS. 16(a) and 16(b) are a plan view and a perspective view, respectively showing a further embodiment, FIG. 16(a) showing a quartz unit provided with terminal metal fittings and FIG. 16(b) showing the bent state of the terminal metal fittings.
Figure 16B:
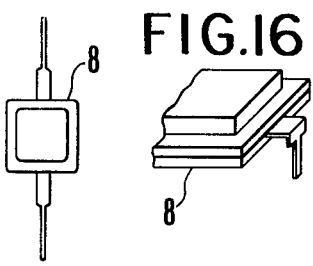

FIG. 15 shows a still further embodiment of the invention. In this case, the stem part 6-1 of the terminal metal fitting 6 is formed to have a width D for a portion a thereof continuing to the branch part 6-2 and to have a much narrower width d for a portion b leading to the frame. The quartz unit 8 formed in this manner has the portion b of the stem part 6-1 serve as lead wire for mounting on a printed circuit board as shown FIG. 16(a). In mounting the quartz unit 8 on a printed circuit board, the lead wire-like portions of the terminal metal fittings of the quartz unit are bent as shown in FIG. 16(b). The quartz unit 8 then can be readily mounted in place by inserting the bent lead wire-like portions into mounting holes.

Further, the container halves 7a and 7b may be arranged to have the quartz vibrator set closer to one of the container halves, for example, closer to the container half 7b, by bending the terminal metal fittings 6a and 6b into a suitable shape as shown in FIG. 7. This arrangement then permits the other half 7a of the container to be formed merely into a shape of plate-like lid.

As described in the foregoing, the invention permits automation of all assembly work, fine adjustment of frequency, etc. to facilitate manufacture of many quartz units of uniform characteristics.

What is claimed is:

1. A quartz unit comprising:
   a quartz vibrator;
   a pair of opposed Y-shaped terminal metal fittings, each including a stem part having a first end and a second end,
      a pair of branch parts each protruding angularly from said first end of said stem and being angularly spaced relative to one another, and
      a support part for said quartz vibrator located at the end of each said branch parts spaced from said stem part and said support parts protruding in a direction generally opposite to the direction of said stem part from the first end to the second end thereof, said support parts on each said terminal metal fitting confronting in spaced relation said support parts on the other said terminal metal fitting, and said support parts being bent relative to said branch parts and arranged to carry the quartz vibrator with said support parts located in a common plane;
   said quartz vibrator having a pair of electrodes with each said electrode connected to a different one of said terminal metal fittings through one of said support parts thereon; and
   a container comprising a front and a rear part enclosing and supporting said terminal metal fittings with said front and rear parts joined together and sealed in an airtight manner.

2. A quartz unit acccording to claim 1, wherein said stem part, branch parts and support parts of each said terminal metal fitting are formed into one unified body obtained by punching from a metal plate.

3. A quartz unit according to claim 1, wherein said container parts are formed of an insulating material.

4. A quartz unit according to claim 3, wherein said container parts are formed of glass.

5. A quartz unit according to claim 1, wherein said container parts have a rectangular pan-like shape.

6. A quartz unit according to claim 1, wherein said quartz vibrator is bonded to said support parts.

7. A quartz unit according to claim 1, wherein the contacting surfaces of said container parts are coated with a softenable material so that the softenable material can be heated and then allowed to harden after the container parts have been placed in contacting engagement.

8. A quartz unit according to claim 1, wherein nitrogen gas is introduced into said container so that in the sealed airtight condition a nitrogen gas atmosphere is present within said container.

9. A quartz unit according to claim 1, wherein said stem has a first part extending from said branch parts and a second part extending from said first part remote from said stem parts, said first part having a greater width than said second part, and said second part serves as a lead wire for mounting the quartz unit on a printed circuit board.

* * * * *